(12) United States Patent
Shim et al.

(10) Patent No.: US 12,051,772 B2
(45) Date of Patent: Jul. 30, 2024

(54) DISPLAY DEVICE AND MANUFACTURING METHOD THEREOF

(71) Applicant: Samsung Display Co., Ltd., Yongin-si (KR)

(72) Inventors: Seung Bo Shim, Anyang-si (KR); Chang Woo Kwon, Seoul (KR); Bong-Kyun Kim, Hwaseong-si (KR); Jin SueK Kim, Suwon-si (KR); Hyo Suk Park, Seoul (KR); Ho Kil Oh, Seoul (KR); Eung Gyu Lee, Cheonan-si (KR); Wan-Soon Im, Cheonan-si (KR); Joon Hoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 17/447,655

(22) Filed: Sep. 14, 2021

(65) Prior Publication Data
US 2022/0085264 A1 Mar. 17, 2022

(30) Foreign Application Priority Data
Sep. 16, 2020 (KR) .......................... 10-2020-0119265

(51) Int. Cl.
H01L 33/12 (2010.01)
H01L 33/62 (2010.01)

(52) U.S. Cl.
CPC ...... *H01L 33/62* (2013.01); *H01L 2933/0066* (2013.01)

(58) Field of Classification Search
CPC ......... H01L 33/00; H01L 33/12; H01L 33/62; H01L 33/005; H01L 23/48; H01L 23/481; H01L 23/525; H01L 27/12; H01L 25/075; H01L 25/0753; H01L 21/027; H01L 21/0274; H01L 2933/0066; H10K 59/12; H10K 59/38; H10K 59/80; H10K 59/131; H10K 59/1201; H10K 59/8792
(Continued)

(56) References Cited

U.S. PATENT DOCUMENTS

2012/0013827 A1* 1/2012 Yoon ....................... H01L 33/46
438/34
2016/0163678 A1* 6/2016 Park ..................... H01L 23/481
257/737

FOREIGN PATENT DOCUMENTS

JP 2005-049738 A 2/2005
KR 10-2016-0049178 A 5/2016
(Continued)

*Primary Examiner* — Chuong A Luu
(74) *Attorney, Agent, or Firm* — Lewis Roca Rothgerber Christie LLP

(57) ABSTRACT

A display device includes: a first substrate; a plurality of metal layers on the first substrate and separated from each other; a buffer layer on the metal layer; a semiconductor layer on the buffer layer; a gate conductive layer on the semiconductor layer; a data conductive layer connected to the semiconductor layer; and a light-emitting element connected to the data conductive layer, wherein the metal layer includes a first portion partially overlapping the semiconductor layer in a third direction perpendicular to the surface of the first substrate, a second portion where the metal layer completely overlaps the semiconductor layer in the third direction, and a third portion where the metal layer does not overlap the semiconductor layer in the third direction.

13 Claims, 20 Drawing Sheets

(58) Field of Classification Search
USPC .......................................................... 257/79
See application file for complete search history.

(56) References Cited

FOREIGN PATENT DOCUMENTS

| | | |
|---|---|---|
| KR | 10-2017-0001881 A | 1/2017 |
| KR | 10-1848501 B1 | 5/2018 |
| KR | 10-1950824 B1 | 2/2019 |

* cited by examiner

DISPLAY DEVICE AND MANUFACTURING METHOD THEREOF

CROSS-REFERENCE TO RELATED APPLICATION

The present application claims priority to and the benefit of Korean Patent Application No. 10-2020-0119265 filed in the Korean Intellectual Property Office on Sep. 16, 2020, the entire content of which is incorporated herein by reference.

BACKGROUND

1. Field

Aspects of some embodiments of the present disclosure relate to a display device and a manufacturing method thereof.

2. Description of the Related Art

Display devices may include thin film transistors, including a gate electrode, an active layer, a source electrode, and a drain electrode. The thin film transistor may have a structure in which the active layer is positioned on the gate electrode or a structure in which the gate electrode is positioned on the active layer according to a structure in which the electrodes are located.

In the case of the structure in which the gate electrode is positioned on the active layer, the active layer may be directly exposed to light inflowing from the bottom of the substrate. Accordingly, a light leakage current may occur in the active layer, and defects such as crosstalk may occur.

To prevent this, a light shielding film may be provided under the active layer. In order to provide such a light shielding film, a separate mask process may be utilized. As a separate mask process is added, a manufacturing process and manufacturing cost may increase.

The above information disclosed in this Background section is only for enhancement of understanding of the background and therefore the information discussed in this Background section does not necessarily constitute prior art.

SUMMARY

Aspects of some embodiments of the present disclosure relate to a display device and a manufacturing method thereof, and for example, to a manufacturing method of a display device in which a metal layer and a semiconductor layer are formed by the same process, and a display device manufactured by this method.

Aspects of some embodiments include a display device and a manufacturing method thereof that may simplify the manufacturing process.

According to some embodiments of the present invention, a display device includes: a first substrate; a plurality of metal layers on the first substrate and separated from each other; a buffer layer on the metal layer; a semiconductor layer on the buffer layer; a gate conductive layer on the semiconductor layer; a data conductive layer connected to the semiconductor layer; and a light-emitting element connected to the data conductive layer, wherein the metal layer includes a first portion partially overlapping the semiconductor layer in a third direction perpendicular to the surface of the first substrate, a second portion where the metal layer completely overlaps the semiconductor layer in the third direction, and a third portion where the metal layer does not overlap the semiconductor layer in the third direction.

According to some embodiments, the entire area of the semiconductor layer may overlap the metal layer.

According to some embodiments, the data conductive layer may further include a plurality of data lines arranged along a second direction parallel to the surface of the first substrate, and the third portion of the metal layer may overlap the data line in the third direction.

According to some embodiments, the data conductive layer may further include a driving voltage line arranged along the second direction parallel to the surface of the first substrate, and the first portion of the metal layer may overlap the driving voltage line in the third direction.

According to some embodiments, the first portion, the second portion, and the third portion of the metal layer may be separated from each other.

According to some embodiments, the third portion may not be connected to the data conductive layer.

According to some embodiments, the data conductive layer may include a first data conductive layer and a second data conductive layer insulated from each other via the data insulating layer, the first data conductive layer and the second data conductive layer may have the planar shape overlapping in the third direction, and the first data conductive layer and the second data conductive layer may be in contact with each other in the opening in the data insulating layer.

According to some embodiments, the semiconductor layer on the second portion may be connected to the data line.

According to some embodiments, the semiconductor layer on the first portion may be connected to the light-emitting element.

According to some embodiments, the third portion may configure a dummy light blocking layer that is not connected to wiring of the display device.

According to some embodiments, a second substrate overlapping the first substrate in the third direction perpendicular to the surface of the first substrate and a red color conversion layer, a green color conversion layer, and a transmission layer on the second substrate to be separated from each other may be further included, and the light-emitting element may emit blue light.

According to some embodiments, the red color conversion layer, the green color conversion layer, and the transmission layer may overlap each light-emitting element in the third direction.

According to some embodiments, a red color filter between the red color conversion layer and the second substrate, a green color filter between the green color conversion layer and the second substrate, and a blue color filter between the transmission layer and the second substrate may be further included.

According to some embodiments of the present invention, in a manufacturing method of a display device, the method includes: sequentially depositing a metal layer, a buffer layer, and a semiconductor layer on a substrate; forming a first photoresist including a first portion having a first thickness and a second portion having a second thickness that is thinner the first thickness on the semiconductor layer; etching the semiconductor layer, the buffer layer, and the metal layer that do not overlap the first photoresist; ashing the first photoresist to remove the second portion of the first photoresist; etching the semiconductor layer that does not overlap the first photoresist by using the ashed first photoresist; and removing the first photoresist.

According to some embodiments, in the forming of the first photoresist including the first portion having a first thickness and the second portion having the second thickness that is thinner the first thickness on the semiconductor layer, a second photoresist having the first thickness and a third photoresist having the second thickness may be on the semiconductor layer.

According to some embodiments, in the etching of the semiconductor layer, the buffer layer, and the metal layer that do not overlap the first photoresist, the semiconductor layer, the buffer layer, and the metal layer that do not overlap the second photoresist and the third photoresist may be etched together.

According to some embodiments, in the ashing of the first photoresist to leave only the first portion, the second photoresist may be ashed to be thinner, and the third photoresist may be removed.

According to some embodiments, in the etching of the semiconductor layer that does not overlap the first photoresist by using the ashed first photoresist, the semiconductor layer that overlapped the removed third photoresist may be etched.

According to some embodiments, in the removing of the first photoresist, the second photoresist may be removed.

According to some embodiments, the metal layer region that overlaps the first photoresist may include a first portion where the part of the metal layer overlaps the semiconductor layer and the part does not overlap the semiconductor layer after removing the first photoresist, the region that overlaps the second photoresist may configure a second portion where the metal layer entirely overlaps the semiconductor layer after removing the second photoresist, the metal layer region that overlaps the third photoresist may configure a third portion where the metal layer does not overlap the semiconductor layer, and the first portion, the second portion, and the third portion may be separated from each other.

According to some embodiments of the present disclosure, the display device may have a relatively simplified manufacturing process.

DETAILED DESCRIPTION

Figure 1:
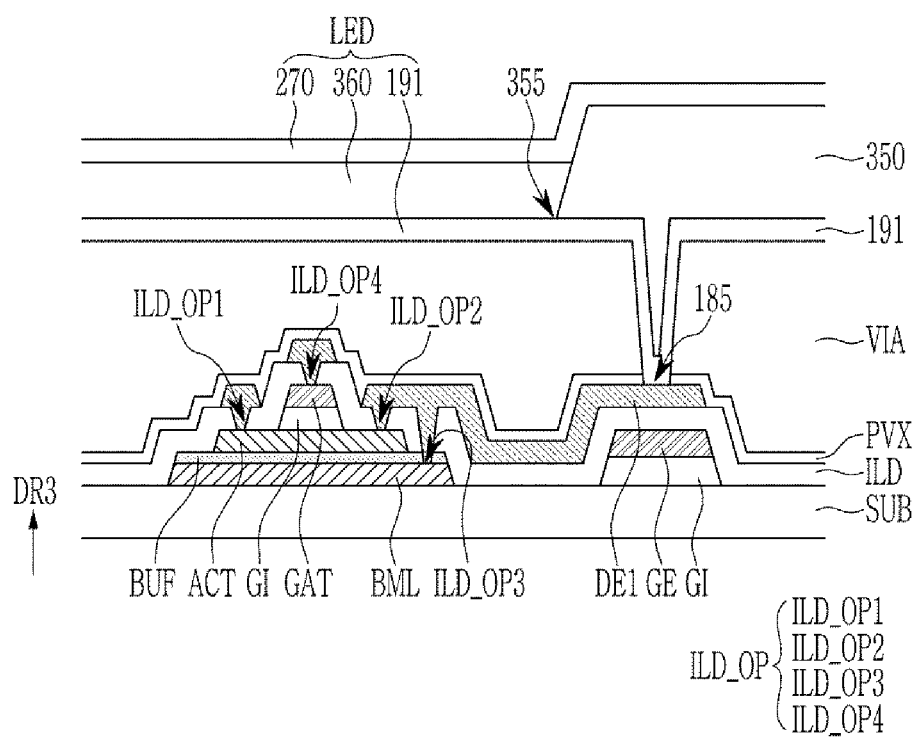
FIG. 1 is a schematic view showing a cross-section of a display device according to some embodiments.

Aspects of some embodiments of the present invention will be described more fully hereinafter with reference to the accompanying drawings, in which embodiments of the invention are shown. As those skilled in the art would realize, the described embodiments may be modified in various different ways, all without departing from the spirit or scope of embodiments according to the present invention.

The drawings and description are to be regarded as illustrative in nature and not restrictive. Like reference numerals designate like elements throughout the specification.

Further, because sizes and thicknesses of constituent members shown in the accompanying drawings are arbitrarily given for better understanding and ease of description, the present invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Now, a display device according to some embodiments of the present invention is described in more detail with reference to accompanying drawings.

FIG. 1 is a schematic view showing a cross-section of a display device according to some embodiments. Referring to FIG. 1, a metal layer BML is located on a substrate SUB. The metal layer BML may include a metal and may prevent or reduce instances of external light entering the semiconductor layer ACT. For example, the metal layer BML may have a double layer structure of copper and titanium.

A buffer layer BF is positioned above the metal layer BML. The buffer layer BF may include an inorganic insulating material such as a silicon nitride (SiNx), a silicon oxide (SiOx), and a silicon oxynitride (SiOxNy). The x and y may be 1 to 10, respectively. The buffer layer BUF may be a single layer or multi-layered structure of the material.

The entire buffer layer BF may overlap with the metal layer BML. That is, the shape of the buffer layer BF and the metal layer BML may be the same in a plan view (e.g., a view perpendicular or normal with respect to a display surface of the display device). This is described in more detail later, but according to some embodiments of the present invention, the metal layer BML, the buffer layer BF, and the semiconductor layer ACT are formed in the same process using one mask.

Next, a semiconductor layer ACT is located on the buffer layer BF. The semiconductor layer ACT may include any one of amorphous silicon, polycrystalline silicon, and AN oxide semiconductor. According to some embodiments, the semiconductor layer ACT may include an oxide semiconductor. For example, the semiconductor layer ACT may include Indium-Gallium-Zinc Oxide (IGZO) among In—Ga—Zn-based oxides.

The entire region of the semiconductor layer ACT can be overlapped with the metal layer BML in a third direction DR3 perpendicular to the surface of the substrate SUB. This is a structure derived because the metal layer BML and the semiconductor layer ACT are formed in a single process using one mask. That is, according to some embodiments, the metal layer BML may be located between the semiconductor layer ACT and the substrate SUB.

However, as shown in FIG. 1, the part region of the metal layer BML may not overlap with the semiconductor layer ACT. The metal layer BML may be connected to the first data conductive layer DE1 in the region that does not overlap with the semiconductor layer ACT.

Next, referring to FIG. 1, a gate insulating layer GI and a gate electrode GAT are located on the semiconductor layer ACT and the substrate SUB. The channel of the semiconductor layer ACT is formed in the region overlapping the gate electrode GAT in the third direction DR3. The source region and drain region of the semiconductor layer ACT may be located on respective sides of the channel region.

The gate insulating layer GI may have substantially the same plane shape as the gate electrode GAT. This is because the gate insulating layer GI and the gate electrode GAT are formed in the same process using one mask. The gate insulating layer GI may include the inorganic insulating materials such as a silicon nitride (SiNx), a silicon oxide (SiOx), and a silicon oxynitride (SiOxNy). The gate insulating layer GI may be a single layer or multi-layered structure of the material.

The gate electrode GAT may include molybdenum (Mo), aluminum (Al), copper (Cu), and/or titanium (Ti), and may have a single layer or multi-layered structure of the material.

Next, an interlayer insulating layer ILD is formed or arranged. The interlayer insulating layer ILD) may include the inorganic insulating materials such as a silicon nitride (SiNx), a silicon oxide (SiOx), and a silicon oxynitride (SiOxNy). The interlayer insulating layer ILD may include a plurality of openings ILD_OP.

The first opening ILD_OP1 and the second opening ILD_OP2 of the interlayer insulating layer may overlap the semiconductor layer ACT. The first opening ILD_OP1 and the second opening ILD_OP2 of the interlayer insulating layer may overlap the source region and the drain region of the semiconductor layer ACT. The third opening ILD_OP3 of the interlayer insulating layer may overlap the region of the metal layer BML that does not overlap the semiconductor layer ACT. The fourth opening ILD_OP4 of the interlayer insulating layer may overlap the gate electrode GAT.

Next, a first data conductive layer DE1 may be located on the interlayer insulating layer ILD. The first data conductive layer DE1 may be in contact with the semiconductor layer ACT at the first opening ILD_OP1 and the second opening ILD_OP2 of the interlayer insulating layer. Also, the first data conductive layer DE1 may be in contact with the gate electrode GAT at the fourth opening ILD_OP4 of the interlayer insulating layer. In addition, the first data conductive layer DE1 may be in contact with the metal layer BML at the third opening ILD_OP3 of the interlayer insulating layer. The first data conductive layer DE1 may include a plurality of regions spaced apart from each other.

The first data conductive layer DE1 may include any suitable conductive material including, for example, aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may be a single layer of the material or a multi-layered structure.

The passivation layer PVX may be located on the first data conductive layer DE1. The passivation layer PVX may include an inorganic insulating material such as a silicon nitride (SiNx), a silicon oxide (SiOx), and a silicon oxynitride (SiOxNy). The passivation layer PVX may be omitted according to some embodiments.

An insulating layer VIA may be located on the passivation layer PVX. The insulating layer VIA may be an organic layer. For example, organic insulating materials such as generally-used polymers such as poly(methylmethacrylate) (PMMA) or polystyrene (PS), polymer derivatives having phenolic groups, acryl-based polymers, imide polymers, polyimides, acryl-based polymers, siloxane polymers, etc. may be included.

The passivation layer PVX and the insulating layer VIA may include an opening 185 overlapping the first data conductive layer DE1.

A first electrode 191 may be located on the insulating layer VIA. The first electrode 191 may be in contact with the first data conductive layer DE1 at the opening 185. The first electrode 191 may receive a data voltage from the first data conductive layer DE1. The first electrode 191 may be an anode.

A partition wall 350 may be located on some regions of the first electrode 191. The partition wall 350 contains an opening 355 that overlaps the first electrode 191.

An emission layer 360 may be located in the opening 355 of the partition wall 350. A second electrode 270 may be located on the partition wall 350 and the emission layer 360.

The first electrode 191, the emission layer 360, and the second electrode 270 may constitute a light-emitting device (LED).

Referring to FIG. 1, in the display device according to some embodiments of the present invention, the metal layer BML, the buffer layer BUF, and the semiconductor layer ACT are formed in the same process using one mask.

Therefore, the entire surface of the semiconductor layer ACT overlaps the metal layer BML. Accordingly, it is economical to improve the reliability of the transistors including semiconductor layer ACT and reduce the number of masks used in the manufacturing process.

Hereinafter, the display device according to some embodiments of the present invention is described in more detail.

Figure 2:
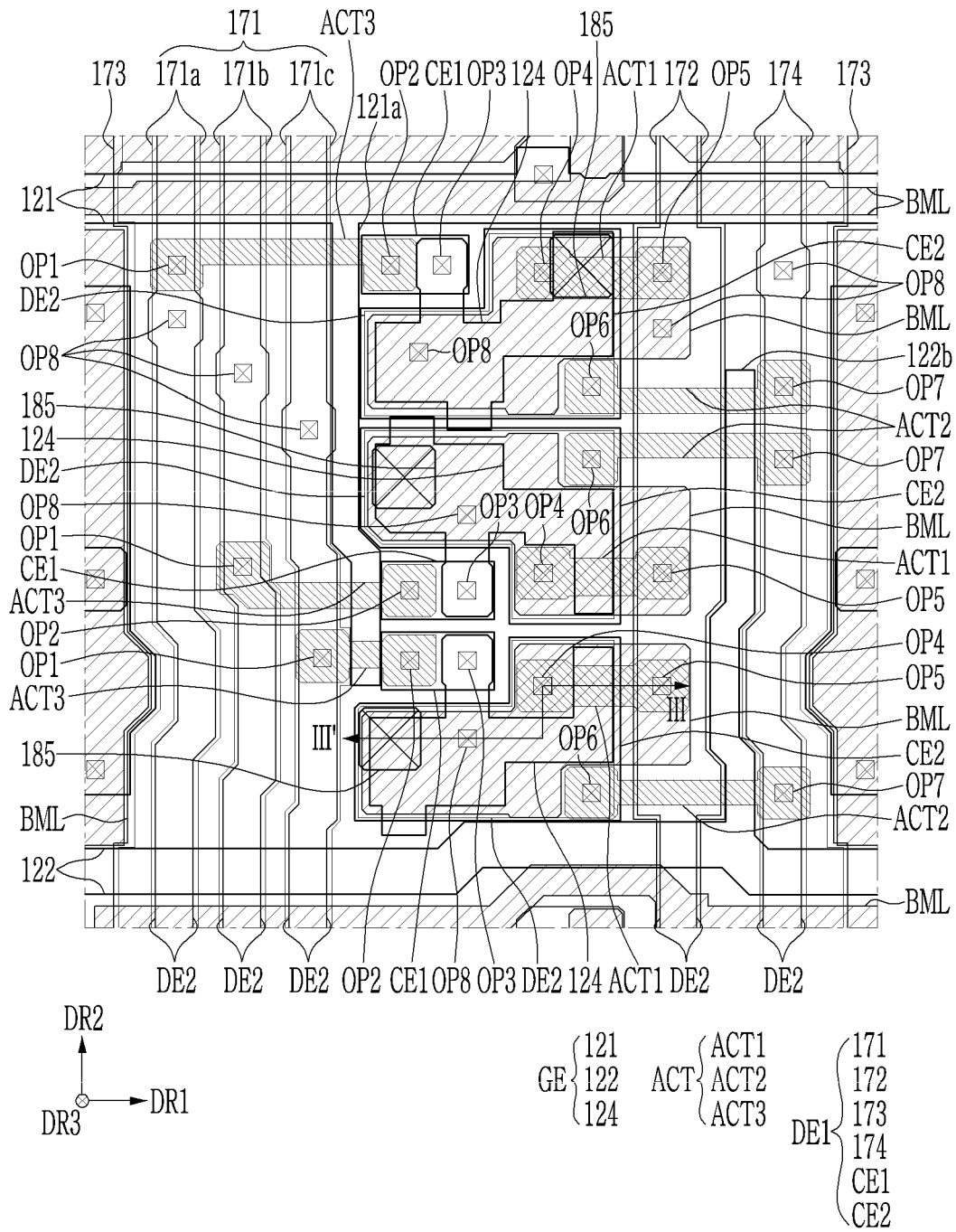
FIG. 2 is a view showing a plane layout of a display device according to some embodiments.
Figure 3:
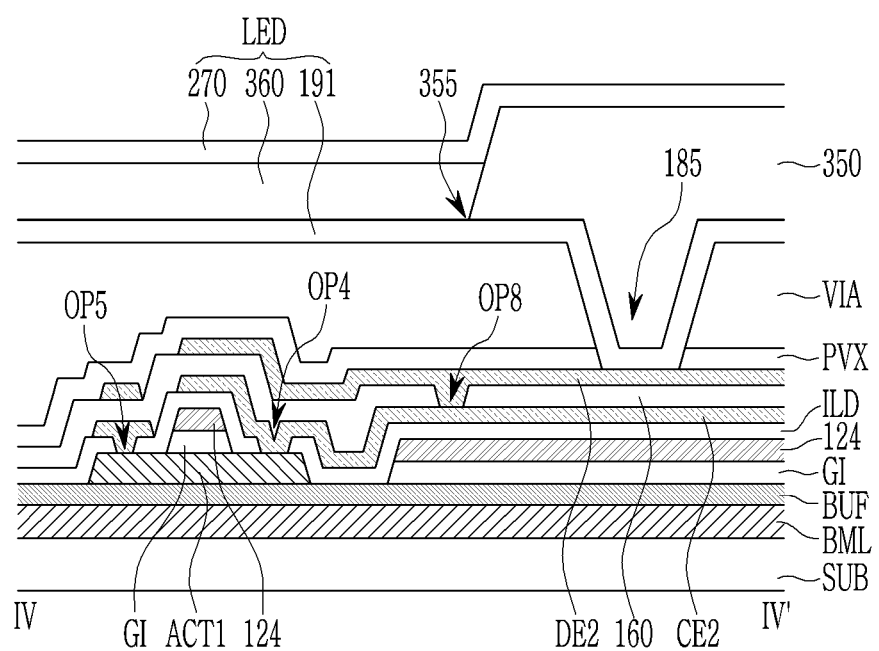
FIG. 3 is a view showing a cross-section of a display device of FIG. 2 taken along a line III-III'.

FIG. 2 is a view showing a plane layout of a display device according to some embodiments. FIG. 3 is a view showing a cross-section of a display device of FIG. 2 taken along a line III-III'.

Simultaneously referring to FIG. 2 and FIG. 3, metal layer BML is located on the substrate SUB. FIG. 2 shows three pixels arranged side by side in the second direction DR2, and the metal layer BML may be arranged one by one for each pixel. In addition, the metal layer BML may be arranged in parallel with the wiring along the first direction DR1 and the second direction DR2. The description of the material of the metal layer BML is the same as that in FIG. 1.

Next, a buffer layer BUF is located on the metal layer BML. The buffer layer BUF may have substantially the same plane shape as the metal layer BML. The description for the material of the buffer layer BUF is the same as that in FIG. 1.

Next, the semiconductor layer ACT is located on the buffer layer BUF. The semiconductor layer ACT may include a first semiconductor layer ACT1, a second semiconductor layer ACT2, and a third semiconductor layer ACT3. The metal layer BML and the buffer layer BUF may be located between each semiconductor layer ACT and the substrate SUB.

Next, a gate insulating layer GI is located. The gate insulating layer GI may have the same plane shape as the gate conductive layer GE by being formed in the same process as the gate conductive layer GE positioned later. The description of the material of the gate insulating layer GI is the same as that in FIG. 1.

Next, a gate conductive layer GE is located on the gate insulating layer GI. The gate conductive layer GE may include a first gate line 121 positioned along the first direction DR1, a second gate line 122, and a spaced gate electrode 124. The description of the material of the gate conductive layer GE is the same as that in FIG. 1.

The first gate line 121 may transmit a scan signal, and the first gate line 121 may include a longitudinal part 121a protruded in the second direction DR2. The longitudinal part 121a of the first gate line 121 overlaps with the third semiconductor layer ACT3 and may function as a gate electrode of the third semiconductor layer ACT.

The second gate line 122 may transmit a sensing signal, and the second gate line 122 may include a longitudinal part 122b protruded in the second direction DR2. The longitudinal part 122b of the second gate line 122 overlaps with the second semiconductor layer ACT2 and may function as a gate electrode of the second semiconductor layer ACT2.

The gate electrode 124 is described later, but it may be connected to the third semiconductor layer ACT3 through the first connection electrode CE1. Part of the gate electrode 124 overlaps the second semiconductor layer ACT2 and may function as a gate electrode of the second semiconductor layer ACT2.

Next, referring to FIG. 3, an interlayer insulating layer ILD is located on the gate conductive layer GE. The description of the material of the interlayer insulating layer ILD is the same as that in FIG. 1. The interlayer insulating layer ILD may include a plurality of openings.

A first data conductive layer DE1 is located on the interlayer insulating layer ILD. The first data conductive layer DE1 may include a data line 171 arranged along the second direction DR2, a driving voltage line 172, a VSS line 173, a sensing line 174, a first connection electrode CE1, and a second connection electrode CE2. The description of the material of the first data conductive layer DE1 is the same as that in FIG. 1.

The data line 171 may include a first data line 171a, a second data line 171b, and a third data line 171c positioned along the second direction DR2. Each data line 171a, 171b, and 171c may be connected to each pixel.

Each data line 171 may be connected to the third semiconductor layer ACT3 through the first opening OP1. The other side of the third semiconductor layer ACT3 is connected to the first connection electrode CE1 through the second opening OP2, and the first connection electrode CE1 is connected to the gate electrode 124 through the third opening OP3. Therefore, the data voltage supplied to each data line 171 may be connected to the gate electrode 124.

The driving voltage line 172 is arranged along the second direction DR2 and may be connected to the first semiconductor layer ACT1 through the fifth opening OP5. The first semiconductor layer ACT1 is connected to the second connection electrode CE2 through the fourth opening OP4. Therefore, the driving voltage ELVDD may be transferred to the second connection electrode CE2.

The sensing line 174 is connected to the second semiconductor layer ACT2 through the seventh opening OP7. The other side of the second semiconductor layer ACT2 is connected to the second connection electrode CE2 through the sixth opening OP6.

The VSS line 173 is arranged along the second direction DR2 and may transmit a VSS signal.

Next, simultaneously referring to FIG. 2 and FIG. 3, a data insulating layer 160 is located on the first data conductive layer DE1. Simultaneously referring to FIG. 2 and FIG. 3, the second data conductive layer DE2 has a shape that is substantially similar to that of the first data conductive layer DE1 and may be overlapped therewith.

The second data conductive layer DE2 may be in contact with the first data conductive layer DE1 via the eighth opening OP8. The second data conductive layer DE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may be a single layer of the material or a multi-layered structure. As shown in FIG. 2 and FIG. 3, when the first data conductive layer DE1 and the second data conductive layer DE2 have substantially similar shapes and are contacted through the eighth opening OP8, the resistance of the wiring may be reduced. According to some embodiments, the configuration of the second data conductive layer DE2 may be omitted.

Next, a passivation layer PVX may be located on the second data conductive layer DE2. The description of the material of the passivation layer PVX is the same as that of FIG. 1. The passivation layer PVX may be omitted.

Next, an insulating layer VIA is located on the passivation layer PVX. The description of the material of the insulating layer VIA is the same as that in FIG. 1.

The passivation layer PVA and the insulating layer VIA have an opening 185. The first electrode 191 is located on the insulating layer VIA, and the first electrode 191 is in contact with the second data conductive layer DE2 at the opening 185. The first electrode 191 may be an anode.

A partition wall 350 may be arranged at some regions of the first electrode 191. The partition wall 350 includes an opening 355 that overlaps the first electrode 191.

An emission layer 360 may be located in the opening 355 of the partition wall 350. A second electrode 270 may be located on the partition wall 350 and the emission layer 360. The first electrode 191, the emission layer 360, and the second electrode 270 may constitute a light-emitting device (LED).

Figure 4:
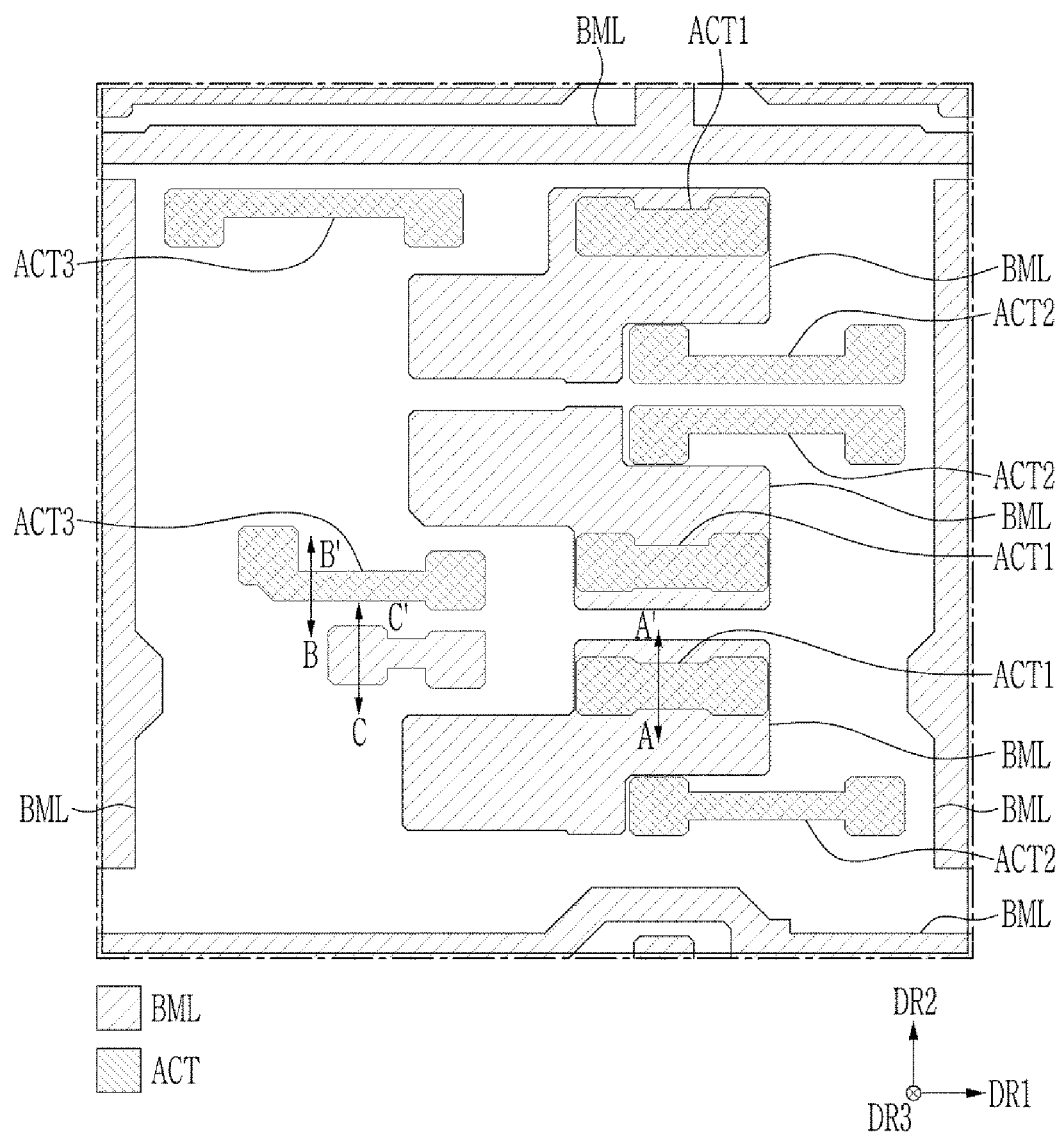
FIG. 4 is a view only showing a configuration of a metal layer BML and a semiconductor layer ACT in a display device of FIG. 2 and FIG. 3.

FIG. 4 is a view only showing a configuration of a metal layer BML and a semiconductor layer ACT in a display device of FIG. 2 and FIG. 3.

Referring to FIG. 4, the first semiconductor layer ACT is located on the metal layer BML, and part of the metal layer BML does not overlap with the first semiconductor layer ACT.

The island-shaped metal layer BML and buffer layer BUF are also located under the third semiconductor layer ACT3 and the second semiconductor layer ACT2 of FIG. 4. The metal layer BML under the second semiconductor layer ACT2 and the third semiconductor layer ACT3 has the same shape as the second semiconductor layer ACT2 and the third semiconductor layer ACT3 and it is not shown in a plan view, but is shown with hatching superimposed on FIG. 4. The island-shaped metal layer BML and the buffer layer BUF are also located under the third semiconductor layer ACT3 and the second semiconductor layer ACT2 because the metal layer BML, the buffer layer BUF, and the semiconductor layer ACT are formed in a single process using one mask as described above. The specific formation process is described later.

Figure 5:
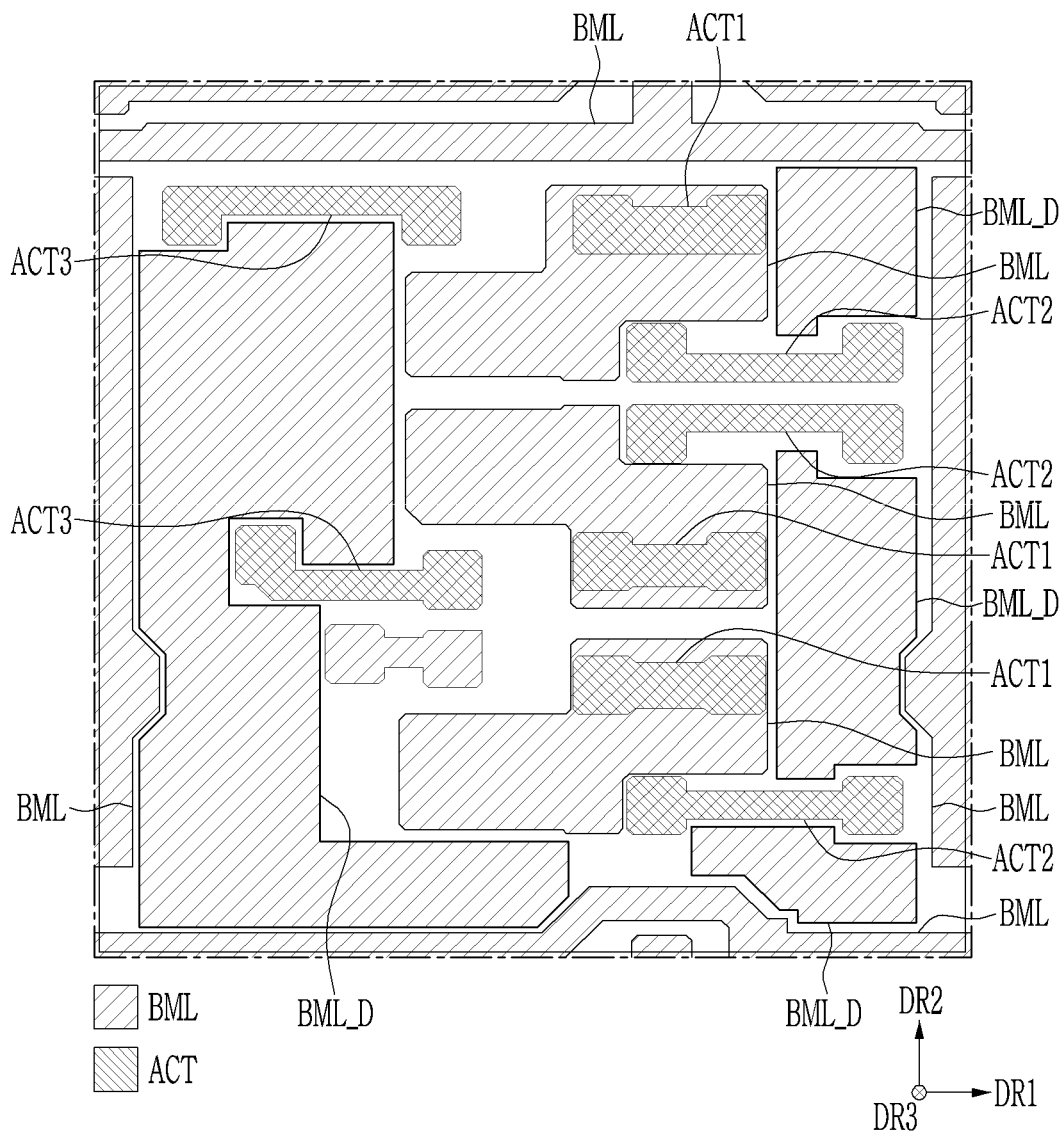
FIG. 5 is a view showing the same plane as FIG. 4 according to some embodiments.

FIG. 5 is a view showing the same plane as FIG. 4 according to some embodiments. Referring to FIG. 5, in the display device according to some embodiments of the present invention, a dummy metal layer BML_D is formed in a region where the semiconductor layer ACT does not overlap. Referring to FIG. 5, the dummy metal layer BML_D may be located on most of the region where the metal layer BML is not located and is arranged to also be overlapping the data line 171, the driving voltage line 172, and the sensing line 174, which are formed later, in the third direction DR3. This dummy metal layer BML is not electrically connected to other constituent elements of the display device but is separated from them.

In the case of forming the dummy metal layer BML in this way, in the process of simultaneously (or concurrently) forming the metal layer BML and the semiconductor layer ACT, an arching due to the metal layer BML of the metal exposed during the etching process of the buffer layer BUF may be prevented or reduced. According to some embodiments, in order to simultaneously (or concurrently) form the metal layer BML, the buffer layer BUF, and the semiconductor layer ACT, each layer is deposited in the entire region and etched in stages. At this time, in the case of the region in which none of the structures among the metal layer BML, the buffer layer BUF, and the semiconductor layer ACT is located, the semiconductor layer ACT is etched, the buffer layer BUF is etched, and then the metal layer BML is etched. At this time, in the process of etching the buffer layer BUF of the inorganic layer, a dry etching process is performed, and in the etching process of the buffer layer BUF, the metal layer BML is widely exposed, so the arching may occur. However, in case of FIG. 5, the area where the buffer layer BUF or the metal layer BML must be removed is smaller than in FIG. 4. Therefore, it is possible to prevent or reduce the arching that may otherwise occur during the etching process of the buffer layer BUF.

Next, the manufacturing method of the display device according to some embodiments of the present invention is described focusing on the formation process of the metal layer BML and the semiconductor layer ACT with reference to accompanying drawings. The manufacturing method according to some embodiments of the present invention is described using the process of forming the structure shown in FIG. 1 as an example.

FIG. 6 to FIG. 14 are process flowcharts showing a manufacturing method of a display device according to some embodiments.

Figure 6:
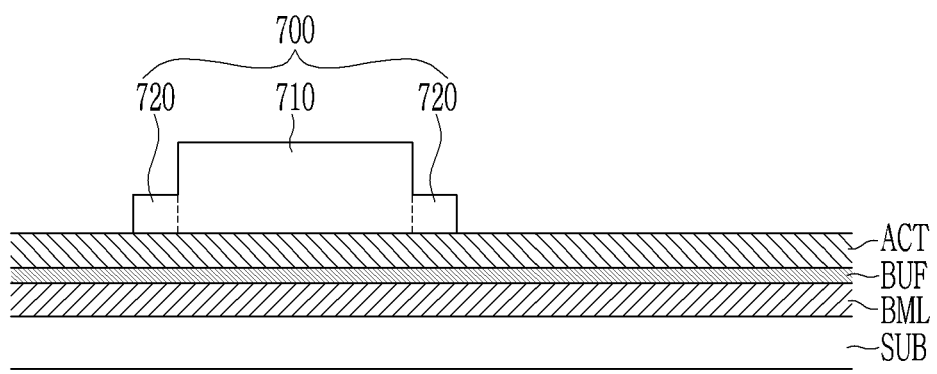
FIG. 6 to FIG. 14 are process flowcharts showing a manufacturing method of a display device according to some embodiments.

Referring to FIG. 6, materials of a metal layer BML, a buffer layer BUF, and a semiconductor layer ACT are sequentially deposited on an entire surface of a substrate SUB.

As an example, the metal layer BML may be a double layer of copper and titanium. For example, the thickness of titanium may be 180 Å to 220 Å, and the thickness of copper may be 2700 Å to 3300 Å. In addition, the buffer layer BUF may be a multilayer of SiNx and SiOx, the thickness of SiNx may be 270 Å to 330 Å, and the thickness of SiOx may be 2500 Å to 3000 Å. The semiconductor layer ACT may include IGZO and may have a thickness of 350 Å to 450 Å. However, the materials and thicknesses are only examples, and the present invention is not limited thereto.

Next, a photoresist 700 is formed thereon. For the photoresist 700, the thickness of the center portion may be thicker than that of the edge portion. That is, the photoresist may include a first portion 710 having a first thickness and a second portion 720 having a second thickness that is thinner than the first thickness. The second portion 720 may be arranged with the first portion 710 therebetween.

Figure 7:
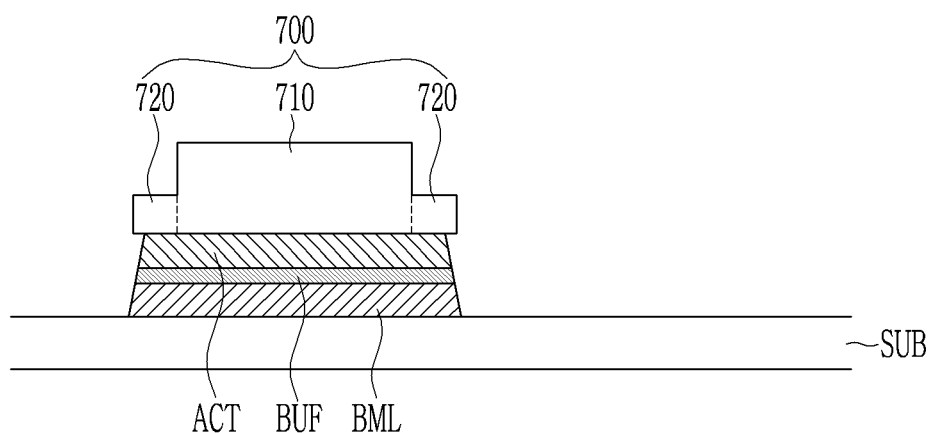

Then, referring to FIG. 7, the region that does not overlap the photoresist 700 is etched. In this case, the semiconductor layer ACT, the buffer layer BUF, and the metal layer BML may be sequentially etched. The semiconductor layer ACT may be etched by a wet etching process, for example, the semiconductor layer ACT may be etched with an etchant containing sulfuric acid and nitric acid as main components. At this time, the etchant may not etch Ti and Cu at all, and IGZO may be etched at an etch rate of 30 Å/s to 50 Å/s, or 100 Å/s to 150 Å/s.

The buffer layer BUF may be etched by a dry etching process.

Next, the metal layer BML may be etched by a wet etching process. At this time, the etchant may contain nitric acid and hydrofluoric acid as main components. The etchant used at this time may have an etch rate of 30 Å/s to 40 Å/s for titanium, 140 Å/s to 160 Å/s for copper, and 40 Å/s to 200 Å/s for IGZO.

Figure 8:
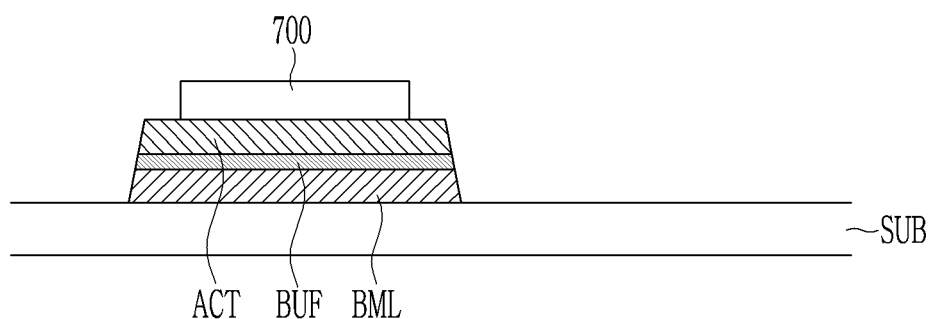

Next, referring to FIG. 8, a photoresist 700 is etched by a plasma process. In this process, only the first portion 710 of the photoresist 700 remains and the second portion 720 is removed. Therefore, the part of the semiconductor layer ACT is not covered by the photoresist 700.

Figure 9:
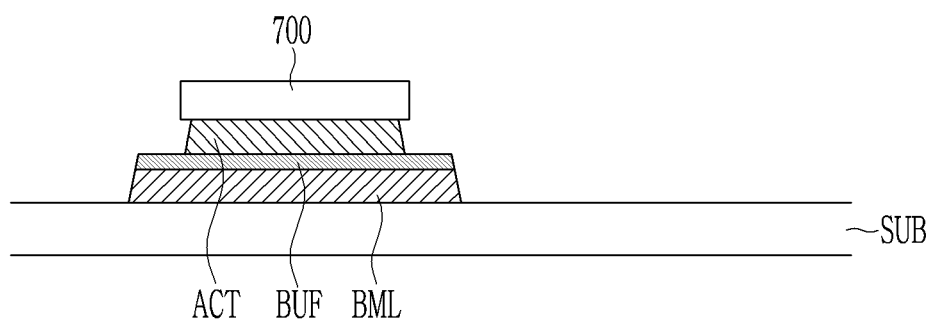

Next, referring to FIG. 9, the semiconductor layer ACT) that is not covered by the photoresist 700 and is exposed is etched. Through this, the planar area of the semiconductor layer ACT is smaller than the planar area of the metal layer BML. Therefore, the part of the metal layer BML does not overlap with the semiconductor layer ACT. The region of the metal layer BML that does not overlap with the semiconductor layer ACT may then be in contact with the data conductive layer.

Figure 10:
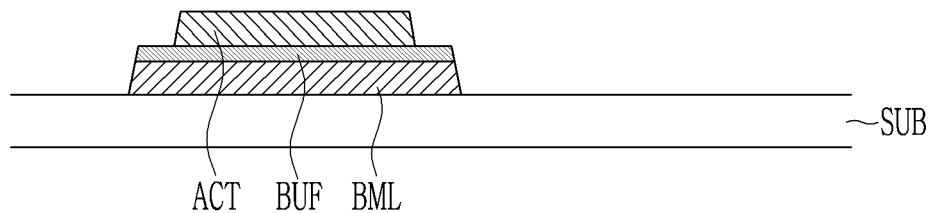

Next, referring FIG. 10, the photoresist 700 is removed.

Figure 11:
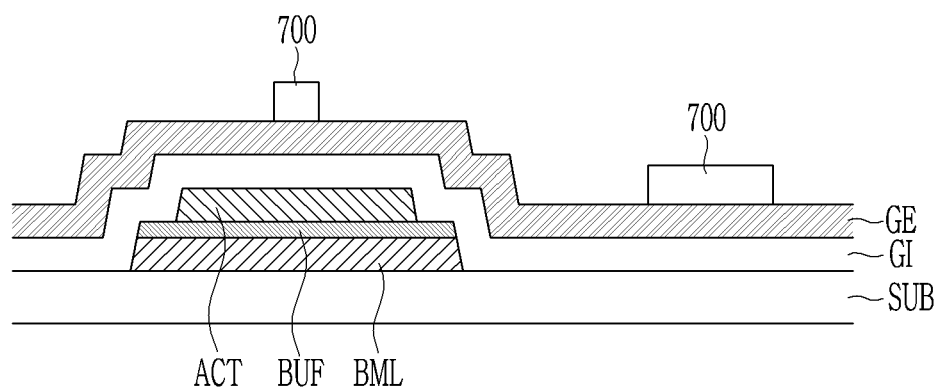

Next, referring to FIG. 11, a gate insulating layer GI and a gate conductive layer GE are formed on entire front side. And, the photoresist 700 is located in some regions. The gate conductive layer GE may be a double layer of copper and titanium. For example, the thickness of titanium may be 180 Å to 220 Å, and the thickness of copper may be 6000 Å to 8000 Å.

Figure 12:
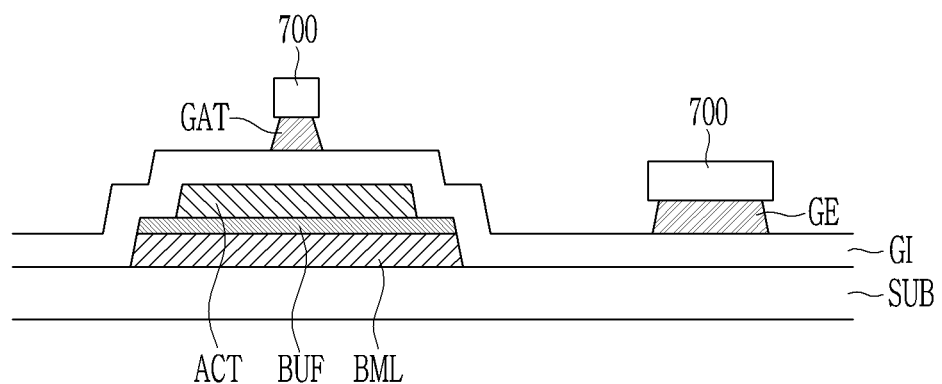

Next, referring to FIG. 12, the gate conductive layer GE that does not overlap with the photoresist 700 is etched. The gate electrode GAT overlapping the semiconductor layer ACT may be formed by the etching of the gate conductive layer GE.

Figure 13:
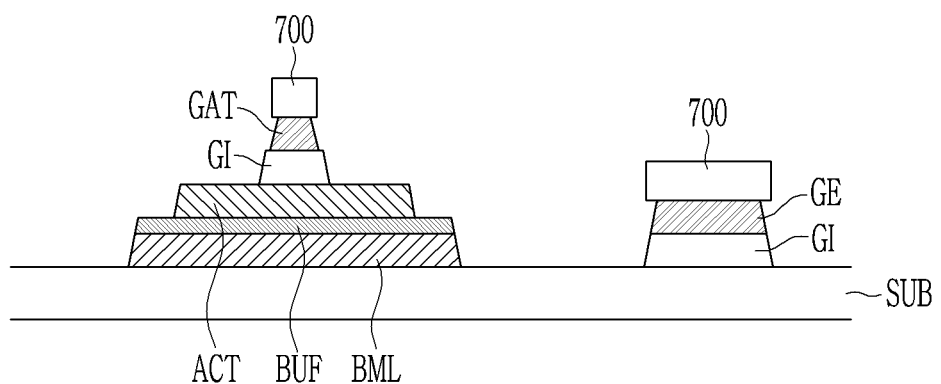

Next, referring to FIG. 13, the gate insulating layer GI is etched. Because the photoresist 700 used to etch the gate conductive layer GE is used as it is, the gate insulating layer GI may also be etched to have the same planar shape as the gate conductive layer GE.

Figure 14:
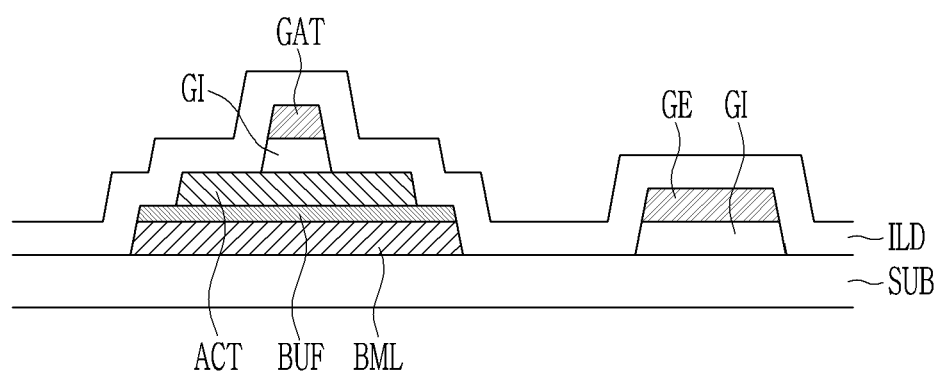

Next, referring to FIG. 14, the photoresist 700 is removed and the interlayer insulating layer ILD is formed. The description of the subsequent steps is omitted.

That is, in the manufacturing method of the display device according to some embodiments, the metal layer BML, the buffer layer BUF, and the semiconductor layer ACT may be formed in the same process or operation using one photoresist 700. Therefore, the buffer layer BUF is located only on the metal layer BML, and all of the semiconductor layer ACT overlaps the metal layer BML. In this way, the metal layer BML, the buffer layer BUF, and the semiconductor layer ACT may be formed in one process, which may relatively simplify the manufacturing process.

Referring to FIG. 4, the display device according to some embodiments includes a region (A-A') where the semiconductor layer ACT is partially located on or overlapping (e.g., only partially overlapping or not entirely overlapping) the metal layer BML, a region (B-B') where the metal layer BML and the semiconductor layer ACT are completely overlapped, and a region (C-C') where the metal layer BML that does not overlap the semiconductor layer ACT is located.

Because such a configuration may be formed simultaneously (or concurrently), and the process of forming each region is described below. FIG. 15 to FIG. 19 are views showing a process with reference to a cross-section of a portion represented by A-A', B-B', and C-C' in FIG. 4.

Figure 15:
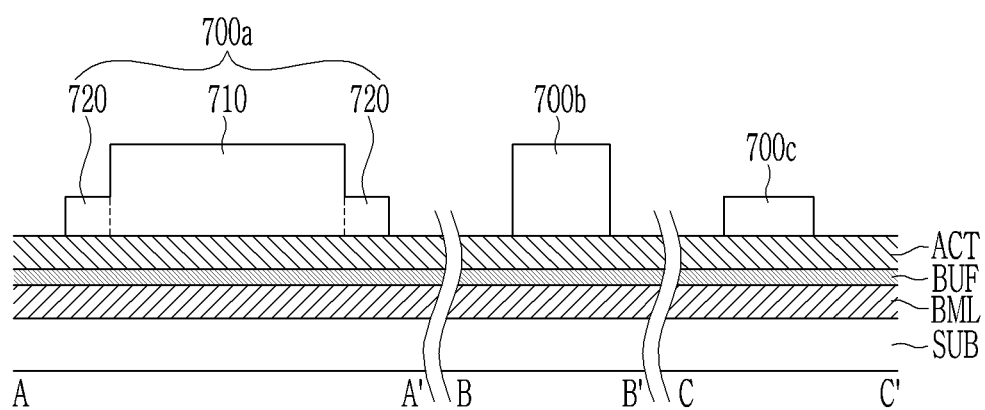
FIG. 15 to FIG. 19 are views showing a process with reference to a cross-section of a portion represented by A-A', B-B', and C-C' in FIG. 4.
Figure 16:
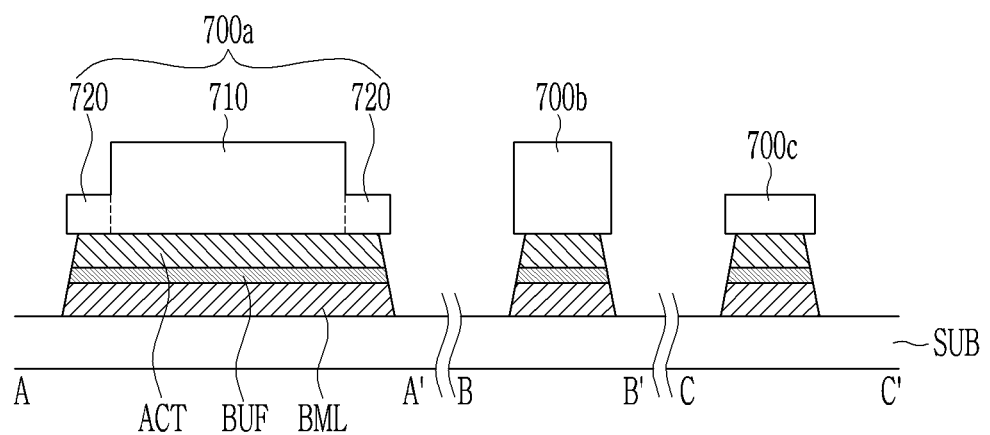

Referring to FIG. 15, materials of the metal layer BML, the buffer layer BUF, and the semiconductor layer ACT are sequentially deposited on the substrate SUB. At this time, the description of the materials of the metal layer BML, the buffer layer BUF, and the semiconductor layer ACT is the same as that in FIG. 6. A plurality of photoresists may be located on the semiconductor layer ACT.

A first photoresist 700a includes a thick first portion 710 and a thin second portion 720. A second photoresist 700b may have a similar thickness to that of the first portion 710 of the first photoresist 700a. A third photoresist 700c may have a similar thickness to that of the second portion 720 of the first photoresist 700a.

Next, referring to FIG. 15, the metal layer BML, the buffer layer BUF, and the semiconductor layer ACT that do not overlap each photoresist 700a, 700b, and 700c are etched. The description of the etching is the same as that in FIG. 7.

Figure 17:
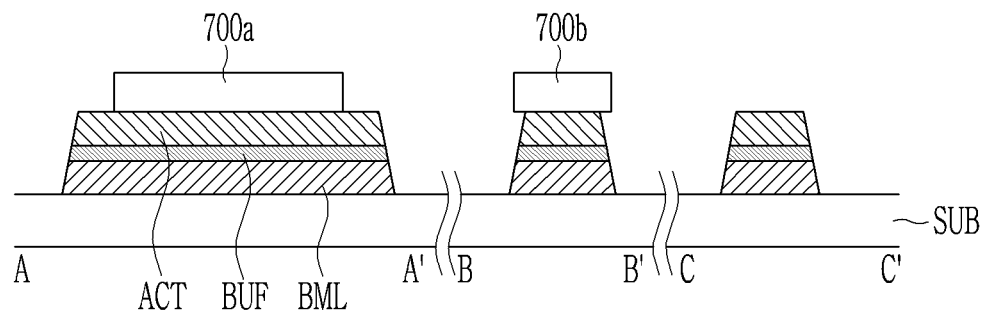

Next, referring to FIG. 17, the photoresist is ashed. In this process, only the first portion 710 of the first photoresist 700a remains, and the second portion 720 is removed. The second photoresist 700b is also thinner. The third photoresist 700c is removed. During the ashing process, the part of the semiconductor layer ACT does not overlap the first photoresist 700a.

Figure 18:
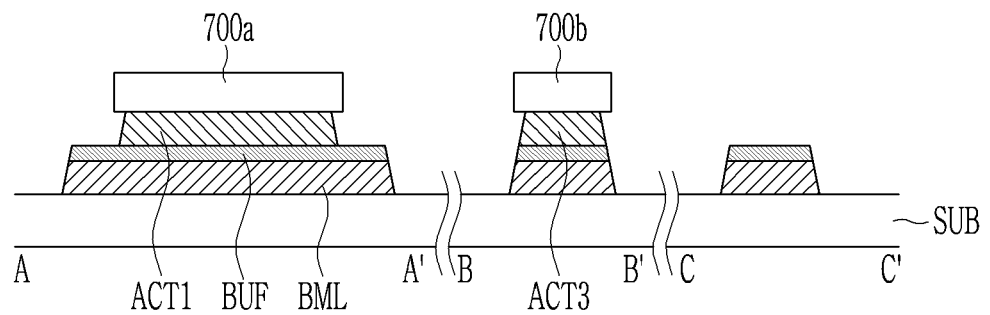

Next, referring to FIG. 18, the semiconductor layer ACT that does not overlap the first photoresist 700a is etched. Accordingly, the first semiconductor layer ACT1 is formed. Part of the metal layer BML does not overlap the first semiconductor layer ACT1. The region under the second photoresist 700b becomes the third semiconductor layer ACT3. The semiconductor layer of the region C-C' where the third photoresist 700c was removed to be the exposed is removed.

Figure 19:
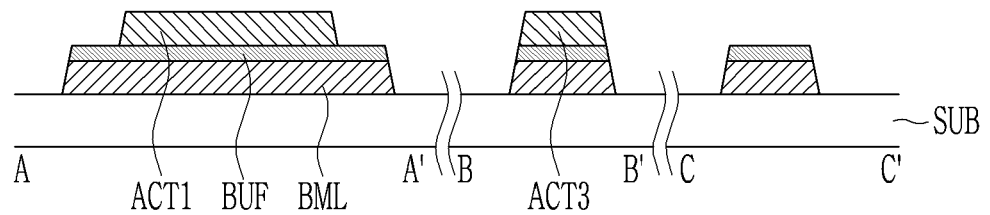

Next, referring to FIG. 19, the photoresists 700a and 700b are removed. The region (A-A') where the semiconductor layer ACT is partially (e.g., only partially) located on the metal layer BML, the region (B-B') where the metal layer BML and the semiconductor layer ACT are completely overlapped, and the region (C-C') where the metal layer BML that does not overlap the semiconductor layer ACT is located are formed through these processes.

Figure 20:
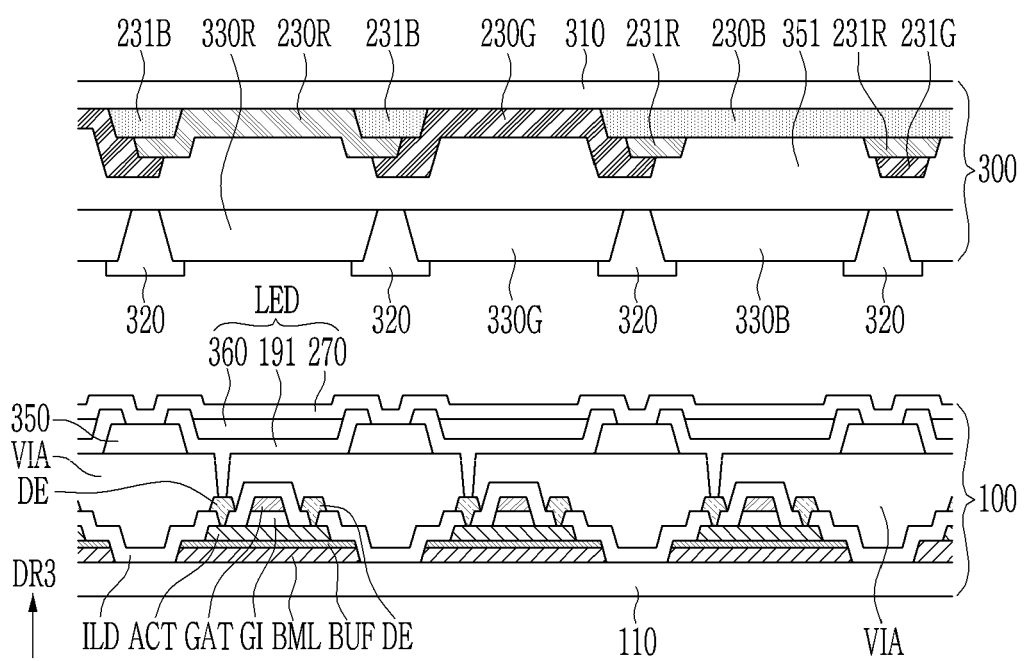
FIG. 20 is a cross-sectional view of a display device according to some embodiments.

The display device according to some embodiments may be a color conversion display device in which a display panel emits blue light and it is converted in to red or green by a color conversion panel 300, and blue light is transmitted. Next, the display device according to some embodiments is described with reference to FIG. 20. FIG. 20 is a cross-sectional view of a display device according to some embodiments.

Referring FIG. 20, the display device according to some embodiments includes a display panel 100 and a color conversion panel 300.

The display panel 100 is shown briefly. The display panel 100 includes a first substrate 110, and the metal layer BML, the buffer layer BUF, and the semiconductor layer ACT which are located on the first substrate 110. The description of each constituent element is the same as described above and thus is omitted. That is, the metal layer BML, the buffer layer BUF, and the semiconductor layer ACT may be formed by the same process.

The gate insulating layer GI and the gate electrode GAT are located on the semiconductor layer ACT. The interlayer insulating layer ILD is located thereon, and the data conductive layer DE and the semiconductor layer ACT are in contact at the opening of the interlayer insulating layer ILD.

The insulating layer VIA is located on the interlayer insulating layer ILD, and the first electrode 191 and the data conductive layer DE are in contact at the opening of the insulating layer VIA. A partition wall 350 is located on the insulating layer VIA, and an emission layer 360 is located between partition walls 350 that are separated from each other. A second electrode 270 is located on the emission layer 360. The first electrode 191, the emission layer 360, and the second electrode 270 may constitute the light-emitting device (LED). The description of each constituent element of the display panel 100 is the same as described above and thus is omitted. The light-emitting device (LED) may emit blue light.

Next, the color conversion panel 300 is described. The color conversion panel 300 includes a blue color filter 230B located on a second substrate 310. A dummy blue color filter 231B may be located on the same layer as the blue color filter 230B. The blue color filter 230B may be formed by overlapping the emission layer 360 in a third direction DR3 perpendicular to the surface of the first substrate 110, and the dummy blue color filter 231B may be formed by overlapping the partition wall 350 in the third direction DR3.

A red color filter 230R may be formed between dummy blue color filters 231B. A dummy red color filter 231R may be formed to be overlapping the blue color filter 230B in the third direction DR3.

A green color filter 230G may be located between the red color filter 230R and the blue color filter 230B. A dummy green color filter 231G may be formed to be overlapping the dummy red color filter 231R in the third direction DR3.

A planarization layer 351 may be located on the color filters 230R, 230G, and 230B and the dummy color filters 231R, 231G, and 231B.

A red color conversion layer 330R, a green color conversion layer 330G, and a transmission layer 330B may be located on the planarization layer 351.

The red color conversion layer 330R may color-convert incident blue light into red light. The red color conversion layer 330R may overlap the red color filter 230R in the third direction DR3. The green color conversion layer 330G may color-convert incident blue light into green light. The green color conversion layer 330G may overlap the green color filter 230G in the third direction DR3. The transmission layer 330B may transmit incident blue light. The transmission layer 330B may overlap the blue color filter 230B in the third direction DR3.

A light blocking member 320 may be located between the red color conversion layer 330R, the green color conversion layer 330G, and the transmission layer 330B. The light blocking member 320 may be formed to be overlapping the partition wall 350 of the display panel 100 in the third direction DR3.

In the display device of FIG. 20, the detailed shape of the metal layer BML, the buffer layer BUF, and the semiconductor layer ACT is the same as that in the embodiments described above.

While aspects of some embodiments of the present invention have been described in connection with what is presently considered to be practical embodiments, it is to be understood that the invention is not limited to the disclosed embodiments. On the contrary, it is intended to cover various modifications and equivalent arrangements included within the spirit and scope of the appended claims, and their equivalents.

| Description of Some of the Reference Symbols | |
|---|---|
| 100: display panel | 110: first substrate |
| 121: first gate line | 122: second gate line |
| 160: data insulating layer | 171: data line |
| 172: driving voltage line | 185: opening |
| 191: first electrode | 300: color conversion panel |
| 310: second substrate | 320: light blocking member |
| 351: planarization layer | 700: photoresist |
| SUB: substrate | BML: metal layer |
| BUF: buffer layer | ACT: semiconductor layer |
| GE: gate conductive layer | DE1: first data conductive layer |
| DE2: second data conductive layer | GI: gate insulating layer |
| ILD: interlayer insulating layer | PVX: passivation layer |
| VIA: insulating layer | |

What is claimed is:

1. A display device comprising:
a first substrate;
a plurality of metal layers on the first substrate and separated from each other;
a buffer layer on the metal layer;
a semiconductor layer on the buffer layer;
a gate conductive layer on the semiconductor layer;
a data conductive layer connected to the semiconductor layer; and
a light-emitting element connected to the data conductive layer,
wherein the metal layer includes a first portion partially overlapping the semiconductor layer in a third direction perpendicular to a surface of the first substrate, a second portion where the metal layer completely overlaps the semiconductor layer in the third direction, and a third portion where the metal layer does not overlap the semiconductor layer in the third direction.

2. The display device of claim 1, wherein an entire area of the semiconductor layer overlaps the metal layer.

3. The display device of claim 1, wherein
the data conductive layer further includes a plurality of data lines arranged along a second direction parallel to the surface of the first substrate, and
the third portion of the metal layer overlaps the data line in the third direction.

4. The display device of claim 1, wherein
the data conductive layer further includes a driving voltage line arranged along the second direction parallel to the surface of the first substrate, and
the first portion of the metal layer overlaps the driving voltage line in the third direction.

5. The display device of claim 1, wherein the first portion, the second portion, and the third portion of the metal layer are separated from each other.

6. The display device of claim 5, wherein the third portion is not connected to the data conductive layer.

7. The display device of claim 1, wherein
the data conductive layer includes a first data conductive layer and a second data conductive layer insulated from each other via the data insulating layer,
the first data conductive layer and the second data conductive layer have a planar shape overlapping in the third direction, and
the first data conductive layer and the second data conductive layer are in contact with each other in an opening in the data insulating layer.

8. The display device of claim 3, wherein the semiconductor layer on the second portion is connected to the data line.

9. The display device of claim 1, wherein the semiconductor layer on the first portion is connected to the light-emitting element.

10. The display device of claim 6, wherein the third portion includes a dummy light blocking layer that is not connected to wiring of the display device.

11. The display device of claim 1, further comprising:
a second substrate overlapping the first substrate in the third direction perpendicular to the surface of the first substrate;
a red color conversion layer, a green color conversion layer, and a transmission layer on the second substrate to be separated from each other, and
the light-emitting element emits blue light.

12. The display device of claim 11, wherein
the red color conversion layer, the green color conversion layer, and the transmission layer overlap each light-emitting element in the third direction.

13. The display device of claim 12, further comprising:
a red color filter between the red color conversion layer and the second substrate;
a green color filter between the green color conversion layer and the second substrate; and
a blue color filter between the transmission layer and the second substrate.

* * * * *